(12) United States Patent
Beaumont et al.

(10) Patent No.: US 7,455,729 B2
(45) Date of Patent: Nov. 25, 2008

(54) METHOD FOR PRODUCING BY VAPOUR-PHASE EPITAXY A GALLIUM NITRIDE FILM WITH LOW DEFECT DENSITY

(75) Inventors: Bernard Beaumont, Valbonne (FR);
 Pierre Gibart, Chateauneuf De Grasse (FR); Jean-Pierre Faurie, Valbonne (FR)

(73) Assignee: Lumilog, Vallauris (FR)

( * ) Notice: Subject to any disclaimer, the term of this patent is extended or adjusted under 35 U.S.C. 154(b) by 172 days.

(21) Appl. No.: 10/522,397

(22) PCT Filed: Jul. 24, 2003

(86) PCT No.: PCT/FR03/02340

§ 371 (c)(1),
(2), (4) Date: Oct. 21, 2005

(87) PCT Pub. No.: WO2004/012227

PCT Pub. Date: Feb. 5, 2004

(65) Prior Publication Data

US 2006/0099781 A1  May 11, 2006

(30) Foreign Application Priority Data

Jul. 24, 2002 (FR) .................................. 02 09375

(51) Int. Cl.
 *C30B 29/38* (2006.01)
(52) U.S. Cl. ............................. 117/84; 117/91; 117/94; 117/95
(58) Field of Classification Search ..................... 117/1, 117/84, 90, 91, 94, 95; 257/1; 438/1
 See application file for complete search history.

(56) References Cited

U.S. PATENT DOCUMENTS 2,866,342 A    12/1958   Moorhead (Continued)

FOREIGN PATENT DOCUMENTS

EP    0942459    9/1999

(Continued)

OTHER PUBLICATIONS

"Reduction mechanisms for defect densities in GaN using one-or two-stop epitaxial lateral overgrowth methods", P. Vennegues, et al., Journal of applied Physics, vol. 87. No. 9, May 1, 2000, pp. 4175-4181.

(Continued)

*Primary Examiner*—Robert M. Kunemund
(74) *Attorney, Agent, or Firm*—Blakely, Sokoloff, Taylor & Zafman LLP

(57) ABSTRACT

The invention concerns a method for preparing gallium nitride films by vapour-phase epitaxy with low defect densities. The invention concerns a method for producing a gallium nitride (GaN) film from a substrate by vapour-phase epitaxy deposition of gallium nitride. The invention is characterized in that the gallium nitride deposition comprises at least one step of vapour-phase epitaxial lateral overgrowth, in that at least one of said epitaxial lateral overgrowth steps is preceded by etching openings either in a dielectric mask previously deposited, or directly into the substrate, and in that it consists in introducing a dissymmetry in the environment of dislocations during one of the epitaxial lateral overgrowth steps so as to produce a maximum number of curves in the dislocations, the curved dislocations not emerging at the surface of the resulting gallium nitride layer. The invention also concerns the optoelectronic and electronic components produced from said gallium nitride films.

17 Claims, 7 Drawing Sheets

U.S. PATENT DOCUMENTS

| | | |
|---|---|---|
| 4,158,322 A | 6/1979 | Hardesty |
| 6,802,902 B2 * | 10/2004 | Beaumont et al. ............. 117/95 |
| 2002/0028564 A1 * | 3/2002 | Motoki et al. ............... 438/460 |
| 2002/0117677 A1 * | 8/2002 | Okuyama et al. ............. 257/94 |

FOREIGN PATENT DOCUMENTS

| | | |
|---|---|---|
| EP | 1005068 | 5/2000 |
| EP | 1088914 | 4/2001 |
| FR | 2 063 759 A | 7/1971 |
| FR | 2 806 788 A | 9/2001 |
| WO | WO 99/20816 | 4/1999 |
| WO | WO 02/01078 A1 | 1/2002 |

OTHER PUBLICATIONS

Fabrication and characterization of low defect density GaN using facet-controlled epitaxial later overgrowth (FACELO), Hiramatsu, et al., Journal of Crystal Growth, vol. 221, No. 1-4, pp. 316-326.

"Dislocation medicated surface morphology of GaN", B. Heying, Journal of Aplied Physics, vol. 85, No. 9, May 1, 1999, pp. 6470-6476, 2000.

"Effect of SB as a Surfactant During the Lateral Epitaxial Overgrowth of Gan by Metalorganic Vapor Phas Epitaxy", Zhang et al, Applied Physics Letters, vol. 79, No. 19, Nov. 5, 2001, pp. 3059-6951.

* cited by examiner

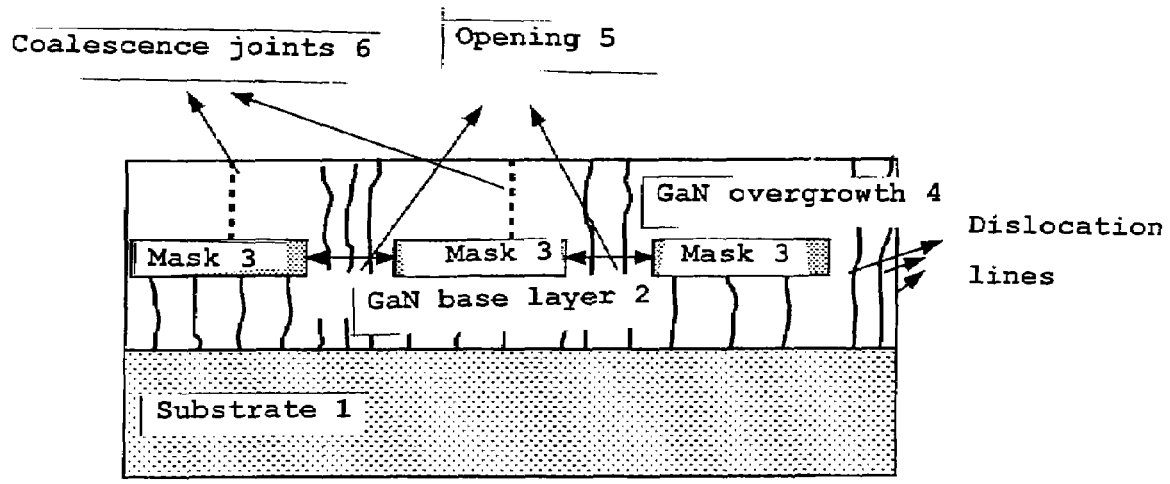
FIG_1
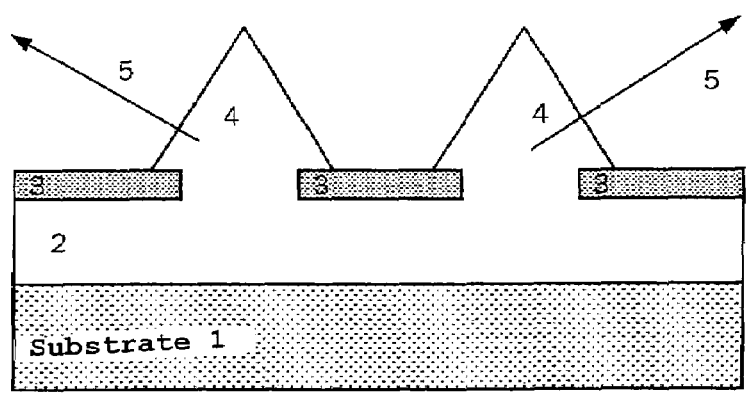
FIG_2
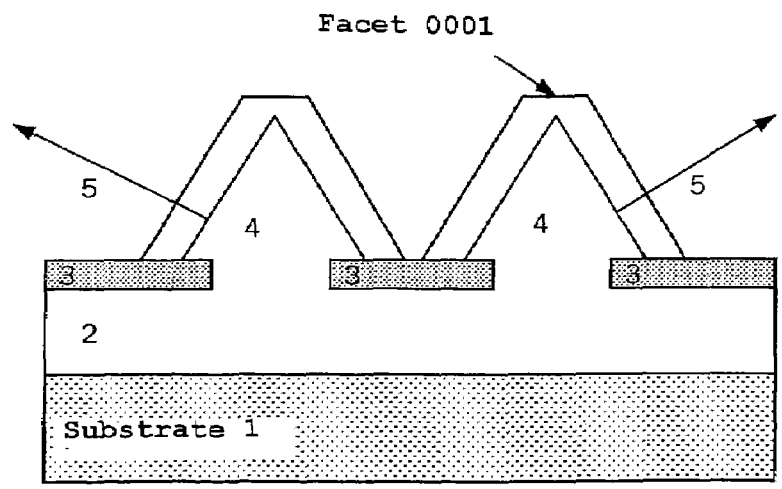
FIG_3

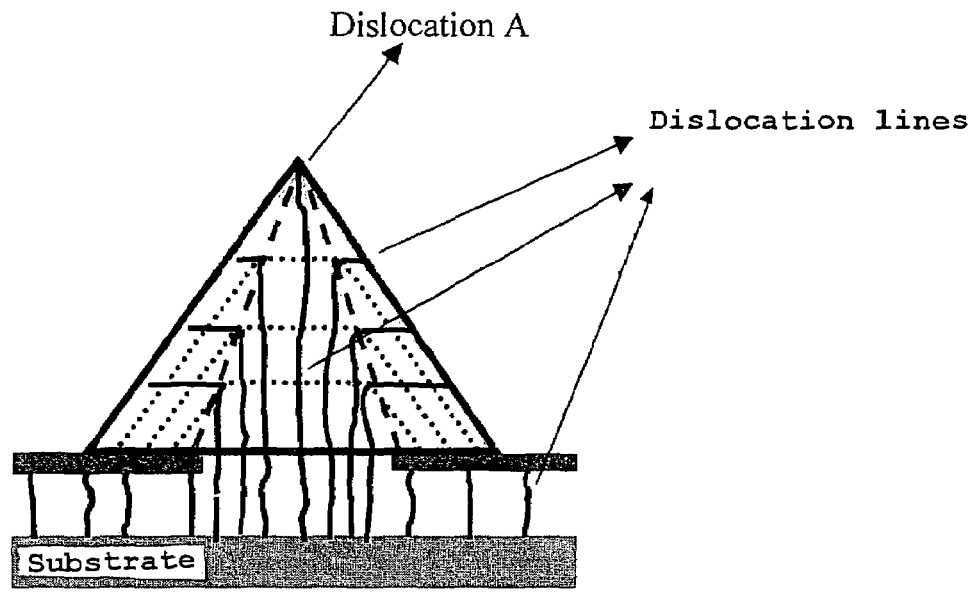
FIG_4
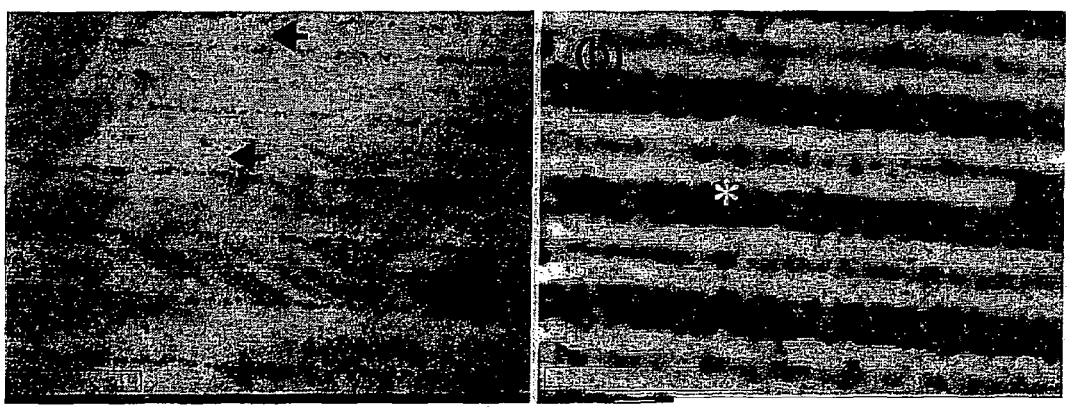
FIG_5

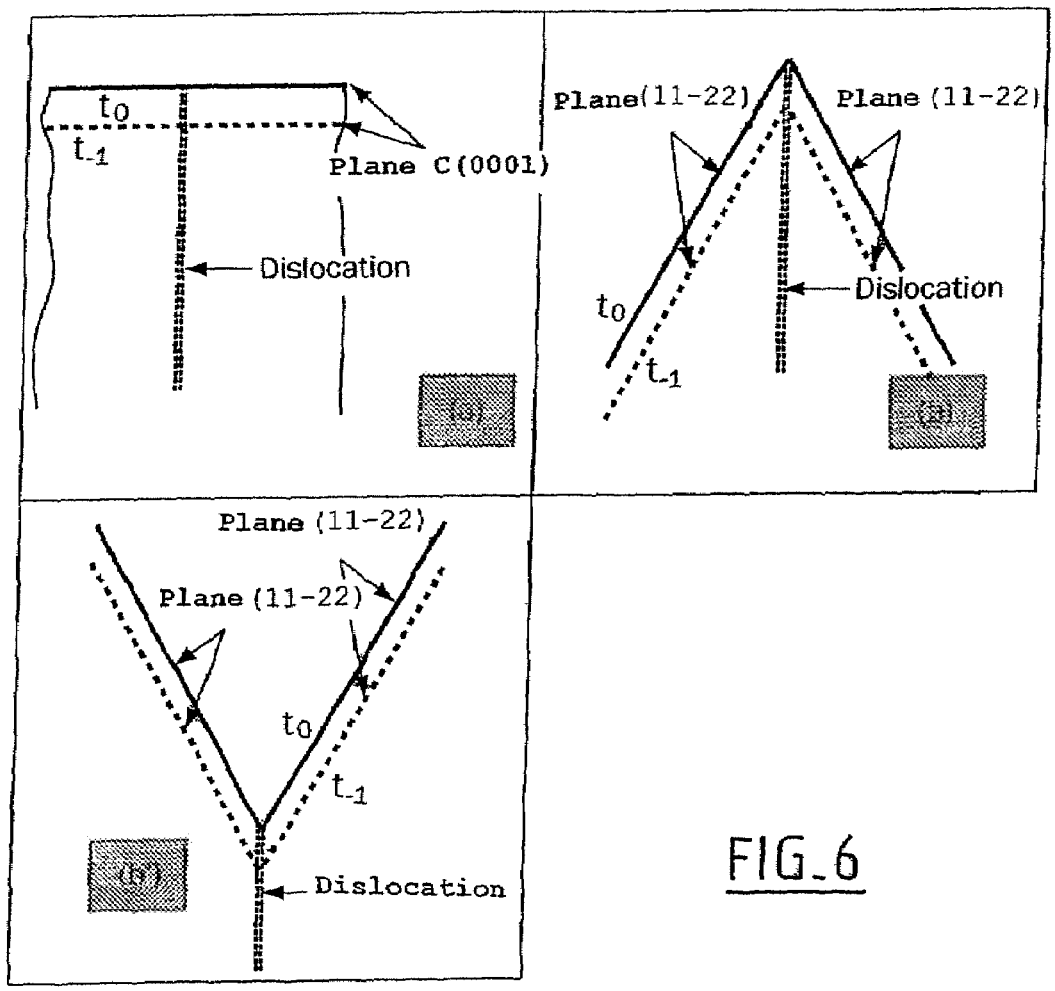
FIG_6
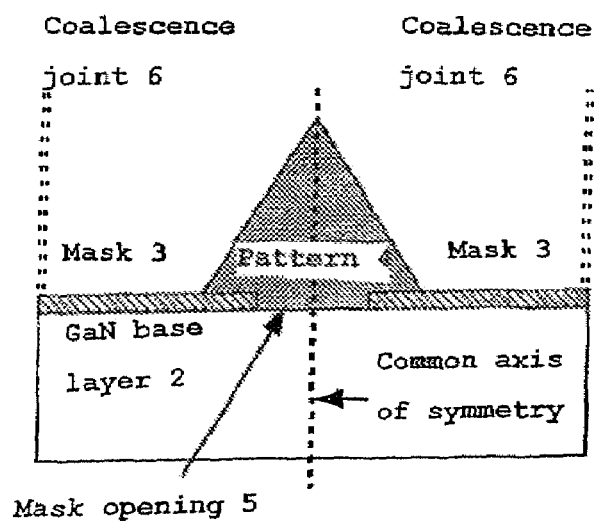
FIG_7

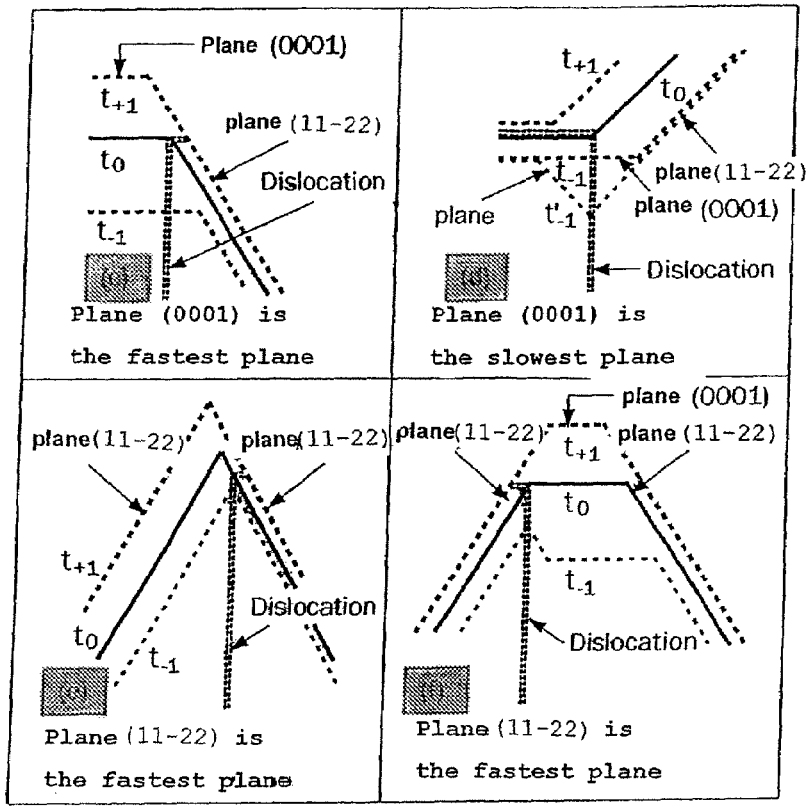
FIG_8
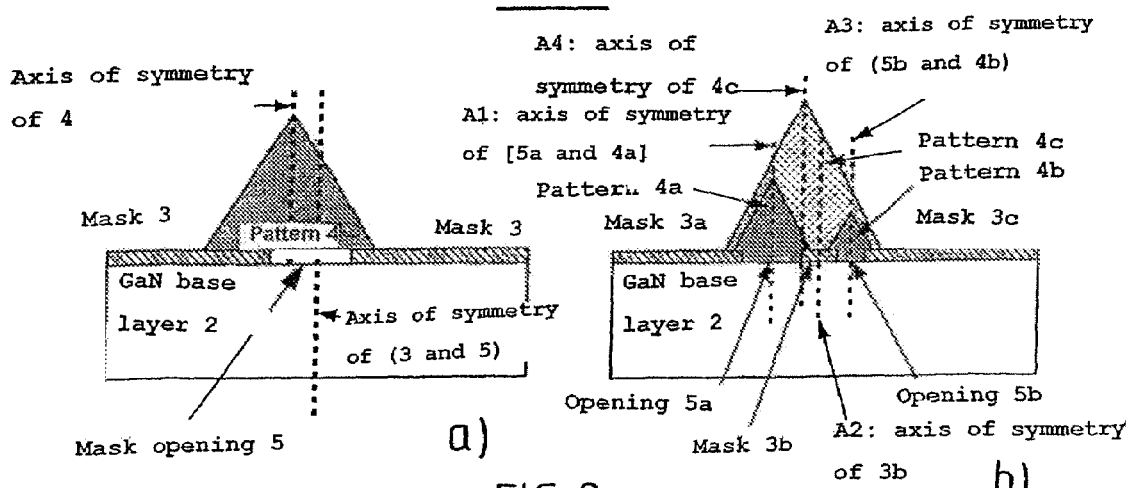
FIG_9

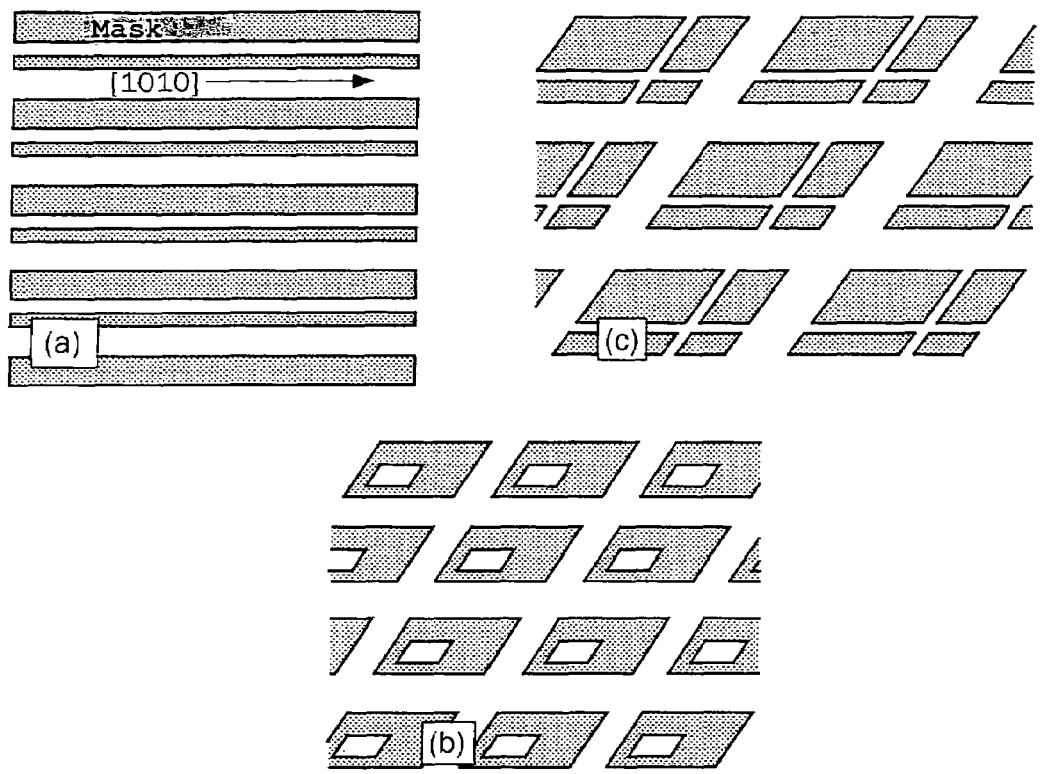
FIG_10
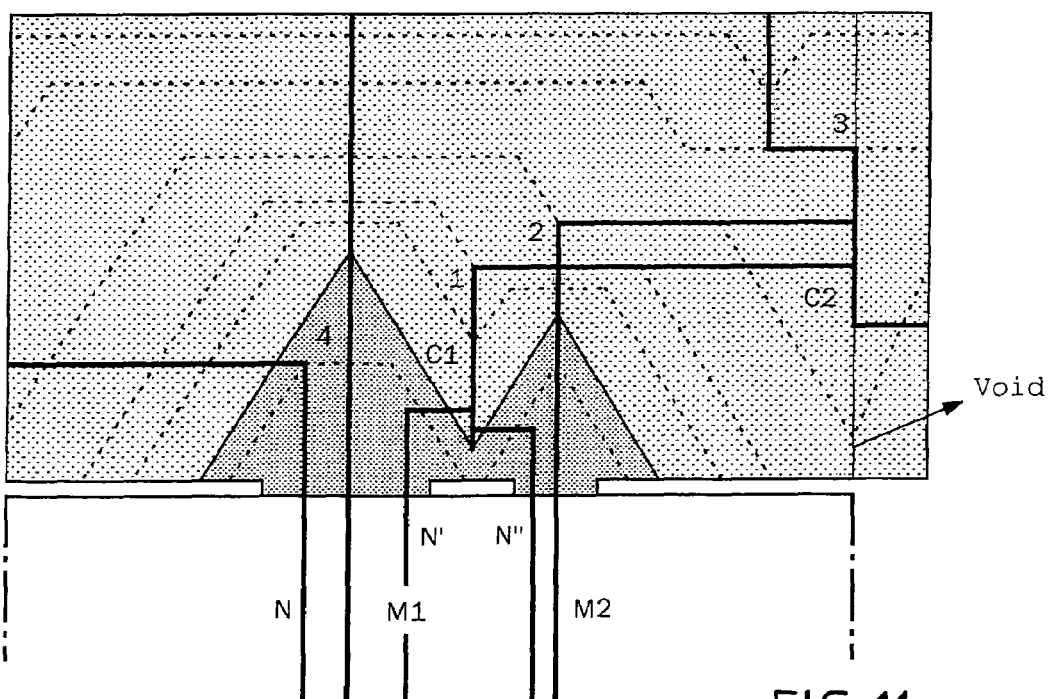
FIG_11

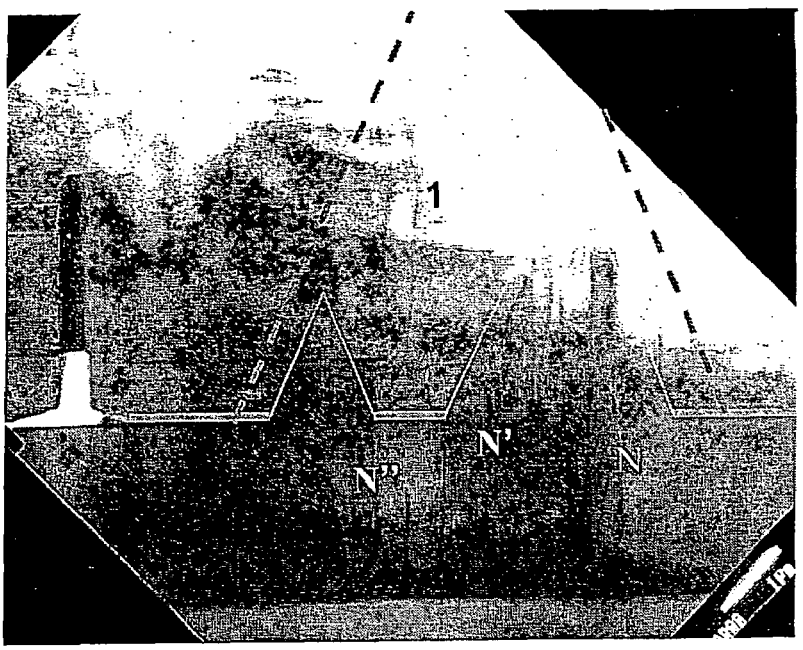
FIG_12
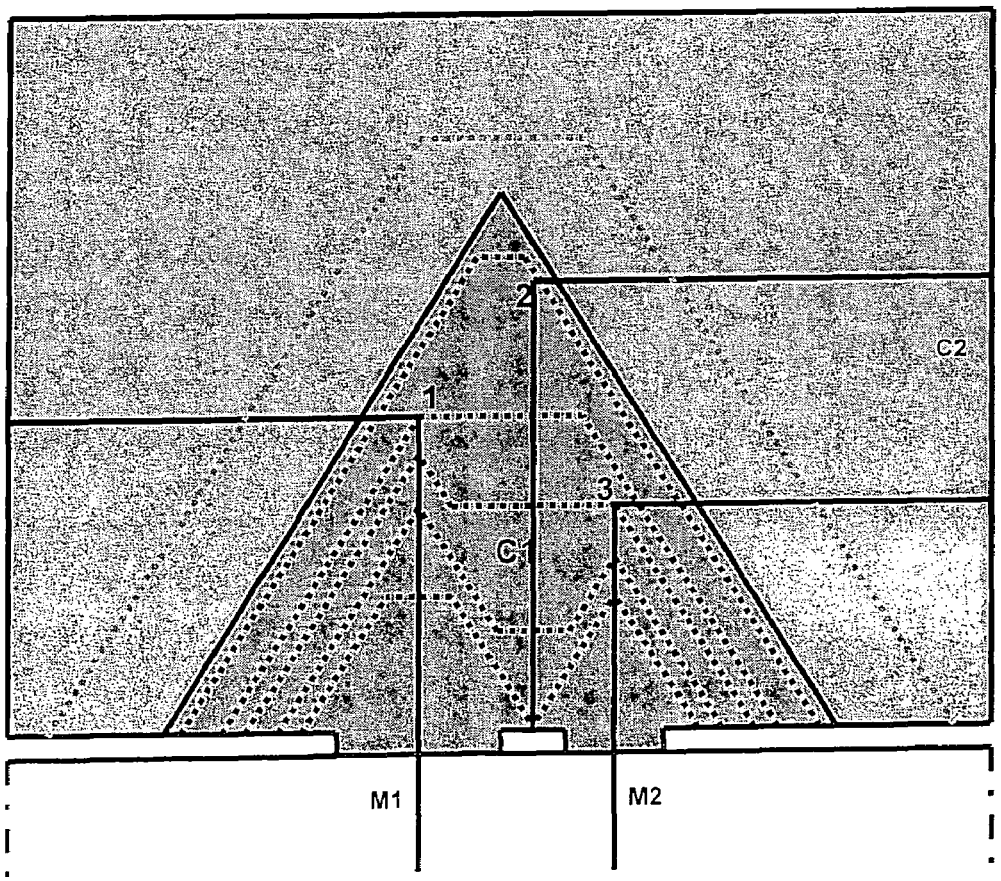
FIG_13

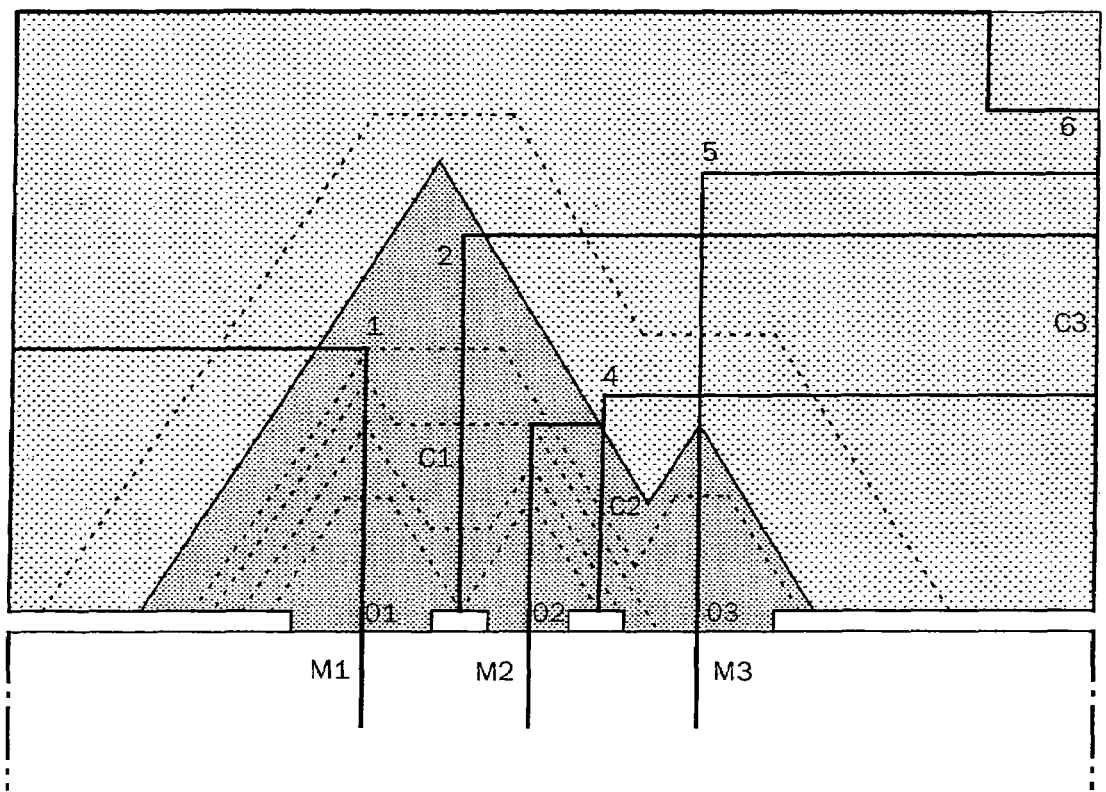
FIG_14

METHOD FOR PRODUCING BY VAPOUR-PHASE EPITAXY A GALLIUM NITRIDE FILM WITH LOW DEFECT DENSITY

The present application is a non-provisional application of International Application No. FR2003/002340, filed Jul. 24, 2003.

This invention relates to the preparation of films made of gallium nitride (GaN) with low defect densities by vapor phase epitaxial.

It also relates to optoelectronic and electronic components made from these gallium nitride films.

At the end of 1995, the Nichia Company made a laser diode from III-V nitrides. This result showed that it is possible to obtain a laser emission from a heteroepitaxial structure in which the dislocation density was as high as $10^8$ to $10^{10}$ cm$^{-2}$. At the end of 1997, Nichia demonstrated that laser emission for 10000 hours could be obtained provided that the structure of the laser diode is made on a good quality GaN layer. This requires GaN layers produced using the ELO (Epitaxial Lateral Overgrowth) technology.

Although it has been asserted for a long time that dislocations in GaN do not behave as non-radioactive recombination centers, it has now been shown that some dislocations with a screw component actually introduce non-radioactive centers and that the component performances are very much better on a better crystallographic quality structure. Thus, the life of laser diodes based on III-V nitride depends critically on the dislocation density in GaN layers on which structures are made.

All efforts being made at the moment are aimed at obtaining heteroepitaxied GaN with the best possible crystalline quality. This is why the ELO (Epitaxial Lateral Overgrowth) technique has been broadly developed for GaN with a large number of variants.

Since solid GaN substrates are not available with a satisfactory surface and in sufficient quantity, III-V based nitride components are made by heteroepitaxy on substrates such as sapphire, Sic, Si or other. The sapphire typically used as a substrate does not have a cleavage plane, which implies that in a laser diode structure based on GaN epitaxial on sapphire, it is difficult to make reflecting facets.

Furthermore., the use of a substrate such as sapphire with a mismatch in the network parameter and the coefficient of thermal expansion generates a very high dislocation density in heteroepitaxial layers of GaN/sapphire.

Regardless of the technology, the density of extended defects (dislocations, stacking defects, inversion domains, annotates) does not drop below $5 \times 10^8$ cm$^{-2}$. Dislocations propagate in the growth direction and emerge on the surface where they can be identified by Atomic Force Microscopy (AFM) or CathodoLuminescence (CL). These dislocations are harmful in several respects. Firstly, with a high density (more than $5 \times 10^8$ cm$^{-2}$), defects degrade electronic mobility and electronic properties (photoluminescence intensity, life of carriers). Furthermore the emergence of surface dislocations results in a surface depression (Haying et al., J. Appl. Phys. 85, 6470, 1999). In a laser diode structure based on Gain multi-quantum wells (MQWs), the dislocations disturb the order of MQWs, and cause non-homogenous light emission. Finally, metals used for pure resistive contacts can also diffuse through these dislocations and annotates.

Different epitaxial lateral overgrowth techniques have been developed for implementation of ELO: 1) by HVPE (Hydride Vapor Phase Epitaxial), 2) by OMVPE (Organ Metallic Vapor Phase Epitaxial), 3) by pseudo-sublimation or more precisely CSVT for Close Space Vapor Transport and 4) miscellaneous variants without mask for example using etched substrates. All can be used to obtain GaN layers with dislocation densities of less than $10^7$ cm$^{-2}$ compared with $10^8$ to $10^{10}$ using the standard technology. However, as we will see later, and as is inherent to the technology used, zones remain in which the dislocation density remains high, above openings and coalescence joints in a technology with an epitaxial step, at coalescence joints and in the middle of openings in a two-step technology in which a first step is carried out to deposit GaN by epitaxial in openings after masking and etching a dielectric layer (particularly by photolithography) to form these said openings followed by a second Epitaxial Lateral Overgrowth (ELO) step in which lateral growth of the initially deposited GaN patterns continues until their coalescence.

One known variant of the growth technology is based on Organ metallic Vapor Phase Epitaxial (OMVPE) using a process that has now been well defined (on sapphire): surface treatment on sapphire, low temperature nucleation of a GaN or AIN layer, annealing of this nucleation layer until the final growth temperature and growth of GaN at high temperature (1000-1100° C.) Several technologies were developed to optimize this heteroepitaxy and to limit the dislocation density in GaN to about $5 \times 10^8$ cm$^{-2}$ (coalescence of islands of GaN, Haffouz et al., Appl. Phys. Lett., 73, 1278 (1998), X. H Wu. et al, Jpn J. Appl. Phys., 35, L1648 (1996)).

The low temperature nucleation layer is no longer necessary on Sic, and the first step is to make an AIN layer at high temperature before the GaN is deposited. However, the dislocation density remains approximately of the order of $5 \times 10^8$ cm$^{-2}$.

Thus, as presented above, epitaxial lateral overgrowth (ELO) and its many variants forms one of the most relevant methods of reducing the dislocation density by several orders of magnitude, in other words to less than about $10^7$ cm$^{-2}$.

The following describes how defect lines propagate in GaN firstly when the ELO process with one-step epitaxy is used, and secondly when the two-step process is used, to better understand the invention.

One-Step Epitaxy Process

The first step is to epitaxy a first layer of GaN on a substrate, and a dielectric mask is then deposited on this layer. The next step is to perform photolithography of openings in this dielectric mask with clearly defined dimensions and crystallographic orientations. Epitaxy is continued on GaN layers thus prepared firstly in the openings; this resumed epitaxy causes lateral growth of GaN crystals which has the effect of reducing the dislocation density by several orders of magnitude. Through dislocations do not propagate above the mask. However, GaN that is epitaxial from the openings, consistent with the initial GaN, maintains the same dislocation density as the initial compound. Furthermore, lateral patterns with a low dislocation density coalesce and, since the initial GaN is in a mosaic pattern, the weak disorientation leads to a region with a high dislocation density in the coalescence plane or the coalescence joint. Consequently, it is impossible to use the entire surface to manufacture optoelectronic components if a one-step ELO is used.

FIG. 1 diagrammatically shows this one-step epitaxy process. A GaN layer is epitaxial (GaN base layer 2) on a substrate 1. A mask 3 (SiO$_2$, SiN$_x$, Al$_2$O$_3$, W, etc.) is then deposited (by CVD, PACVD, catholic sputtering, sublimation, in situ CVD or any other deposition method). Openings are formed on this mask by photolithography, along clearly defined crystallographic directions and with appropriate dimensions, for example 3 μm openings separated by 7 μm along the $[1\text{-}100]_{GaN}$ direction. When GaN growth is resumed, the deposition takes place firstly in the openings 5, then laterally above the mask 4. Above the openings, GaN in epitaxial contact with the substrate, maintains the same defect density as the base layer 2. The black lines in FIG. 1 represent dislocation lines. The GaN laterally grows above the mask (overgrowth of GaN 4). Through dislocations do not propagate in this zone, as is established in the state of art. However, a coalescence joint 6 is formed when the two lateral overgrowth fronts join in the middle of the mask. Therefore the manufacturing technology for a laser diode on an ELO substrate as described above requires a complex technology since the diodes structure has to be made on overgrowth zones 4, between the coalescence joint and the zone in epitaxial contact with the substrate, which requires an alignment precision of the order of one μm.

Two-Step Epitaxy Process

This variant is an improvement to the one-step epitaxy process. It is shown diagrammatically in FIGS. 2, 3 and 4.

FIGS. 2 and 3 are analyzed as follows:

After epitaxying a GaN base layer reference 2 on a sapphire substrate reference 1, an in situ deposit of Sin is made (masks 3), and openings 5 are then etched by photolithography along clearly defined crystallographic directions. The final step is to resume growth which firstly leads to selective epitaxial overgrowth 6.

During the first resumed epitaxy, growth conditions are adjusted to obtain a higher growth rate along direction <0001> than the lateral growth rate, such that overgrowth in the form of strips with a triangular section with facets {11-22} is obtained. The advantage of this procedure is to induce curvature of emerging dislocations at 90° as illustrated in FIG. 4.

This dislocation curvature is explained by energy considerations. The force acting on a dislocation line is the sum of two terms:

one makes this line curved so that it remains normal to the surface, the other tends to align the dislocation line with the Burgers vector (to minimize the dislocation formation energy).

In the second step, the experimental conditions are modified to obtain a lateral growth rate greater than the growth rate along the <0001> direction to obtain total coalescence. FIG. 3 shows an intermediate step in which facet (0001) 7 reappears.

This two-step process is described particularly in patent application WO99/20816. The modification of experimental conditions to obtain a lateral growth rate higher than the growth rate along the <0001> direction may consist of adding magnesium, antimony (Sb) or bismuth (Bi) to cause anisotropic GaN growth (L. Zhang et al, Appl. Phys. Lett., 79, 3059 (2001).

This technology provides a means of obtaining GaN with dislocation densities less than or equal to $10^7$ cm$^{-2}$ (over the entire surface between coalescence zones) (Vennéguès et al, J. Appl. Phys. 87, 4175 (2000)).

There are regions with almost no observable defects between the coalescence zones as can be seen in the images of the surface in cathodoluminiscence presented in FIG. 5, in which part (a) of the figure is an image of a GaN layer obtained by a two-step epitaxy process and part (b) is an image of a GaN layer obtained by a one-step epitaxy process.

These zones with a low defect density are sufficiently wide to make optoelectronic components such as laser diodes. A careful examination of these images shows that there is a significantly higher density of black dots (emergence of dislocations) at approximately the centre of strips defined by coalescence zones, than in the rest of the strip with a low defect density. These dislocations have their origin in the GaN base layer, located in the middle of the openings, which after the growth step emerge near the vertex of triangular overgrowths, and which thus escape the dislocation curvature process. During ELO growth, after selective epitaxy, experimental conditions are such that the facets {11-22} begin to form, and through dislocations at the edge of the mask curve first. FIG. 4 gives a good understanding of this phenomenon. Dislocations in the middle of the mask can escape from this process and emerge on the surface (dislocation A). Furthermore, after curvature, the dislocations propagate parallel to the base plane. The two lateral overgrowth fronts meet and create a coalescence joint. The dislocations that follow the lateral growth front can either terminate in the coalescence zone (in which there may be a void) or they may curve towards the substrate, or they may curve at 90° and emerge on the surface. This coalescence joint in which the through dislocation density is high also limits the useable surface of the ELO substrate.

Therefore, it is clear that this two-step epitaxy process cannot eliminate, all dislocations and particularly dislocations originating in the middle of the masks and coalescence joints.

To complete the description and to give a good understanding of the context of the invention described below, we will now describe the propagation of dislocation lines. The following description is particularly applicable to dislocations that originate in the middle of the mask openings.

FIGS. 6 and 7 illustrate the case in which dislocations might emerge on the surface. We will refer to this figure throughout the remainder of the description when mentioning the different types of symmetry that can be encountered (a), (b) or (b').

FIG. 7 illustrates the case in which the pattern 4 has a trapezoidal or triangular section and the mask 3 have a common axis of symmetry. Emergent dislocations are located at the vertex of the triangular section 4 and coalescence joints 6 form vertical planes. The environment of a dislocation for which the line coincides with the common axis of symmetry is firstly an (a) configuration then (b) then (a) again during growth: it is never curved. Similarly, the environment of a dislocation of the coalescence joint during growth is a type (b') configuration then (a); there is no curvature of its line.

Other variants of the ELO vapor phase technology use textured or periodically etched substrates (Ashby et al. Appl. Phys. Lett. 77, 3233 (2000)) instead of a dielectric mask. In these technologies, etchings are made directly in the substrate, which avoids a growth step and deposition of a mask.

This technique cannot eliminate all dislocations and particularly dislocations originating from the middle of openings and coalescence joints.

Therefore, there is an urgent need to find technical solutions to this problem of dislocations emerging on the surface of GaN films that reduce the useable surfaces of GaN films for manufacturing optoelectronic components, regardless of the process adopted for making the film using one, two or even several epitaxy steps or etching openings directly in the substrate.

The purpose of the invention is to propose a process for making a GaN film that provides a GaN film with low defect densities.

Note that in the context of this invention, the GaN may or may not be doped. Doping substances include particularly magnesium, zinc, beryllium, calcium, carbon, silicon, oxygen, tin and germanium. It is also possible to introduce an iselectronic impurity such as In, Sc, Sb, Bi among the elements in column III or V in the Mendeleev periodic table.

Thus, the purpose of the invention is a process for making a film of gallium nitride (GaN) starting from a substrate, by depositing GaN by vapor phase epitaxy, characterized in that the GaN deposit comprises at least one vapor phase epitaxial lateral overgrowth (ELO) step, and in that at least one of these ELO steps is preceded by etching of openings:
  either in a previously deposited dielectric mask,
  or directly in the substrate,
and in that an asymmetry is introduced into the dislocations environment during one of the ELO steps so as to cause the largest possible number of dislocation curvatures, since curved dislocations do not emerge at the surface of the GaN layer thus obtained.

The asymmetry of the dislocations environment may be induced particularly:

(1) by varying growth parameters either by applying an electric field perpendicular to the growth axis, or by illuminating using a lamp producing UV radiation at about 170 to 400 nm, to cause preferential growth of a single family of facets {11-22}, or (2) by making openings with unequal widths or with unequal geometry, either in the dielectric mask or directly in the substrate to apply geometric shapes to the GaN patterns to facilitate the curvature of dislocations, or in other words making use of specific properties of different geometric shapes that can be taken on by GaN patterns during resumed growth.

This asymmetry provides a means of taking action of most through dislocations originating from mask openings. Consequently, they no longer emerge on the surface.

In particular, the purpose of the invention is a process like that described above, characterized in that asymmetry is introduced by making openings either in the dielectric mask or directly in the substrate, that are adjacent, unequal and asymmetric forming a basic pattern of a periodic network, the basic pattern comprising at least 2 openings, these openings possibly being of different types and particularly lines, hexagons, triangles or a combination of such openings. Preferably, the periodic network defined above extends along a [10-10] direction.

The ELO technology according to this invention is known by the acronym ALFAGEO (Asymmetric Lateral Facet Grown—Epitaxial Overgrowth).

The epitaxial lateral overgrowth step(s) is (are) advantageously made by vapor phase epitaxy from chlorides and hydrides (HVPE), by Organ Metallic paralysis in Vapor Phase Epitaxy (OMVPE), or by CSVT (Close Space Vapor Transport).

It is also possible to perform these epitaxial lateral overgrowth (ELO) steps along one or of the M(1-100), A(11-20), R(1-102), S(10-11) and N(11-23) planes of the substrate, so as to eliminate the piezoelectric field that exists when epitaxy is done along the C(0001) plane.

The substrates may be about a hundred micrometers thick, usually of the order of 200 µm, and may chosen from among sapphire, ZnO, 6H—SiC, 4H—SiC, 3C—SiC, GaN, AlN, LiAiO$_2$, LiGaO$_2$, MgAlO$_4$, Si, HfB$_2$ or GaAs. The substrates may be treated before any deposition of GaN by metrication.

The invention also relates to any GaN film that could be obtained by the process according to the invention. The GaN film thus obtained may be between 1 and 100 µm thick. According to one particular embodiment of the invention, the GaN film obtained may be between 5 and 15 µm thick.

An optoelectronic component is also proposed, and particularly a laser diode, a photo detector or a transistor, characterized in that it is provided with a GaN film that could be obtained by the process according to the invention.

Thus, according to a first variant of the invention openings are made in a dielectric mask, and according to a second variant of the invention the openings are made directly in the substrate.

When the openings are made in the dielectric mask, namely according to the first variant, the process advantageously comprises a two-step epitaxial lateral overgrowth (ELO) using the technique described above.

One of the purposes of the invention is thus to propose a process for making a GaN film that provides a GaN film in which the density of dislocations originating from the middle of the openings and coalescence joints are strongly reduced in the case in which the two-step epitaxy process is adopted for production of the said GaN film.

The case in which facets {11-22} grow at a different rate so as to cause curvature of the dislocation lines or cases in which openings in the mask cause different surface facets are illustrated in FIGS. 8 and 9. In FIG. 8, $t_0$ denotes the first instant at which the dislocation may be curved, and at $t_1$ (previous $t_0$) the dislocation is in a symmetrical environment configuration such as (a) for (c) and (d) or such as (b) for (e) and (f). A $t_{+1}$, the dislocation propagates in the base plane (0001). Configuration (c) is the configuration used in the two-step ELO described above. In configuration (d), $t_1$ and $t'_{-1}$ show two possible geometries leading to the same shape at $t_0$.

In the remainder of the description, reference is made to this Figure when mentioning typical asymmetry cases (c), (d), (e) and (f).

In case (1) above, the applied asymmetry is according to case (e) and in case (2) the applied asymmetry is according to cases (d) and (f).

The asymmetry in application of configuration (d) may also beneficially eliminate coalescence joints, such that the entire ELO surface can be used for manufacture of optoelectronic components.

The dielectric masks that can be used to make this variant of the process according to the invention may be composed of silicon nitride (Sin), SiO$_2$ or W. The dielectric is deposited according to techniques well known to those skilled in the art.

The first deposition of GaN may be made by any vapor phase deposition method, namely HVPE (Hydride Vapor Phase Epitaxy), paralysis in Organometallics Vapor Phase Epitaxy (OMVPE) or Close Space Vapor Transport (CSVT). OMVPE will be used in preference. The gas vector is preferably a mix of N$_2$ and H$_2$. Other vapor phase epitaxy technologies can also be used for this first layer such as MBE, catholic sputtering or laser ablation.

A layer of GaN obtained according to the process described below can advantageously be used for masking followed by resumed epitaxy, from a base layer of GaN.

The substrate is covered by a thickness of silicon nitride approximately equal to one atomic plane. After the dielectric mask has been formed, a layer of GaN is deposited, called the continuous buffer layer. The thickness of this layer may be between 20 and 30 nm. The temperature during this operation may be between 300 and 900° C. The next step is high temperature annealing at between 950 and 1120° C. The buffer layer changes from a continuous layer to a discontinuous layer formed of GaN patterns, or in other words GaN patterns in the form of islands. The zones in which the dielectric has been exposed then act like a mask and the GaN patterns act like GaN zones located in openings made ex situ in the mask. After deposition and annealing of the nucleation layer, a thin layer of GaN, typically 2 to 5 μm thick, is deposited by Organometaillic paralysis in Vapor Phase Epitaxy. The gallium source is Trimethylgallium (TMGa) and the nitrogen source is ammonia. Such a method is described in many documents. This technique is described particularly in patent application WO99/20816, in example 5 that is incorporated herein by reference.

Using this base layer of GaN has the advantage of limiting the dislocation density at the beginning of the process according to the invention.

The following describes different possible embodiments of the first variant of the invention, that are intended to illustrate the invention and do not limit its scope.

All embodiments described below relate to two-step ELO processes like those described above.

Thus, the invention more particularly relates to a process for making a GaN film, characterized in that the GaN deposition that follows the formation of openings is broken down into two-step epitaxy, the first being done under growth conditions such that the growth rate along the <0001> direction is greater than the lateral growth rate and the second being done under modified experimental conditions such that the lateral growth rate is greater than the growth rate along the <0001> direction so as to obtain full coalescence of the patterns.

The modification of growth conditions such that the lateral growth rate becomes greater than the growth rate along the <0001> direction consists of adding magnesium, antimony and bismuth.

According to a first embodiment, adjacent unequal asymmetrical openings are made to form the basic pattern of a periodic network preferably along a [10-10] direction. Examples of such asymmetric opening patterns are shown in FIG. 10. The asymmetric basic pattern is not limited to linear openings, it would be possible to imagine many other patterns such as hexagonal openings parallel to the [10-10] directions or triangular openings. The basis of the invention is to induce propagation of dislocations by asymmetry of the openings that leads to a greater reduction of their density than in the ELO.

After making these asymmetric openings, treatment of the epitaxial, masked and etched substrate, for example as shown in FIG. 10 under deposition conditions, is resumed by epitaxy of gallium nitride so as to induce deposition of gallium nitride patterns on facing zones and anisotropic and lateral growth of the said patterns, lateral growth being continued until coalescence of the said patterns.

For example, FIG. 11 diagrammatically shows the variation of the morphology during ELO of GaN when the widths of the openings are unequal.

During the first step, growth conditions are chosen such that the (0001) plane is a fast plane. This first step terminates when the (0001) plane has disappeared, all GaN patterns obtained by growth from unequal openings then reach a triangular section; the section of the GaN pattern corresponds to the thick black line delimiting the two separate grey areas in FIG. 11.

During this first step (dark grey area delimited by the black line in FIG. 11), through dislocations are curved at 90° when they meet the lateral facets {11-22} during growth (such that N is at point 4 in configuration (c)). Dislocations located at the exact mid-point of small and large openings are not curved (denoted M1 and M2) and continue to propagate vertically beyond this first step. Similarly, if patterns already coalesce at this stage as is the case in FIG. 11, dislocations such as N'and N'' converge towards the coalescence joint (denoted C1), and propagate vertically beyond this first step. The result is a void formed in the middle of the masks.

In the second step, in which growth conditions are modified, the facets (0001) reappear. This second ELO step consists of resumed epitaxy by changing the growth conditions to change the growth anisotropy so that it becomes conducive to planarization of GaN patterns. As described in WO 99/20816, this can be achieved either by adding magnesium in the vapor phase, or by increasing the temperature. In this second step, GaN patterns develop with an expansion of the facet (0001) (which reappears at the vertex of each pattern) while the surface of the lateral facets reduces. Due to the asymmetry of the pattern, the dislocations M2 of the small openings and C1, C2 of the coalescence joints emerge in the lateral facets {11-22} in the type (d) configuration at points 2, 1 and 3 respectively, in which they are subjected to a curvature at 90°. In this embodiment, the small number of type M1 dislocations are not curved. On the other hand, the large number of C2 type dislocations are curved at 3 in the base plane and can interact and cancel each other out. FIG. 12 illustrates this behavior of the dislocations, and the behavior of type N, N'and N'' dislocations of large openings, small openings and type C1 openings respectively that are curved at 1 can be identified.

According to a second embodiment, unequal openings are used differently from the way in which they are used in the first embodiment.

FIG. 13 illustrates an example embodiment of this second embodiment.

As in the first embodiment, growth takes place in two steps that are different in their growth conditions.

But for this second embodiment, the first step terminates when the GaN patterns originating from unequal openings in the mask have completely coalesced to form a single pattern with a triangular section. The intermediate geometries that can be observed during the first step are indicated in a black dashed line in FIG. 13.

In the second step, growth conditions are chosen to achieve planarization by making the base plane C (0001) reappear as shown in a grey dashed line in FIG. 11.

Type C1 and M2 dislocations are curved for reasons mentioned in the description of the first embodiment.

This second embodiment is different from the first in the behavior of type M1 and C2 dislocations. Type M1 dislocations are curved at point 1 because, at this point, M1 is in a (c) configuration. On the other hand, type C2 dislocations are not curved.

In a third embodiment, three unequal openings are used.

The previous two embodiments allow one dislocation type: M1 in the first embodiment and C2 in the second embodiment. These first two embodiments can be combined into a third, so that type M1 and type C2 can both be curved. Once again there are two steps with different growth conditions. This third embodiment is illustrated in FIG. 14.

During the first step, the GaN patterns originating from unequal openings O1 and O2 coalesce to form a pattern with a single triangular section and M1 dislocations are curved; this is the same as the second embodiment. At the same time, the pattern originating from opening O3, located sufficiently far from O2, develops to reach a triangular section. The end of the first step coincides with obtaining a profile shown with a black line in FIG. 14; this is the same as the first embodiment profile. Grain joints (C3 in FIG. 14) are curved at 6.

In a fourth embodiment, asymmetry is introduced during growth.

As mentioned in the introduction, asymmetry may also be created by illuminating the side of the substrate during growth with UV radiation so as to increase the growth rate of a single family of facets {1-212}. An electric field can also be applied perpendicular to the direction of the openings. Asymmetry is introduced into the growth starting from symmetrical etched patterns (or unequal patterns to combine effects), and after coalescence at the end of the first step (or at the beginning of the first step), by increasing the growth rate of one of two equivalent facets {11-22} (for example by illuminating the side of the structure with a UV laser, or by applying an electric field perpendicular to the directions of the openings).

Through dislocations M located in the middle of the mask are not curved in the first phase of the ELO, on the other hand they are curved at 1 (FIG. 8(*e*) when asymmetry is introduced into the facet growth rate {11-22}. The result of the asymmetry is a coalescence joint that is no longer perpendicular to the surface of the substrate, such that the dislocations, after being curved at 90°, join together in the coalescence joint. Some of the dislocations stop in this joint, in which there is often a void, and one part propagates downwards and another part propagates vertically, denoted C. These parts meet a facet {11-22} at 2, and are curved at 90°.

When the openings are etched directly in the substrate, namely according to the second variant, the step for formation of the GaN base layer may be done under the same conditions as described above, in other words when the first variant of the process is implemented.

Similarly, this second variant may advantageously comprise two lateral overgrowth steps (ELO) that may be done under the same conditions as described above, in other words when the first variant of the process is implemented.

The characteristics, purposes and advantages of the invention will also become clear after reading the following example of a particular embodiment of the invention and the attached figures in which:

FIG. 1 represents a one-step epitaxy;

FIG. 2 represents a first step in a two-step epitaxial lateral overgrowth;

FIG. 3 represents a second step in a two-step epitaxial lateral overgrowth;

FIG. 4 shows the variation of the structure before total coalescence. The dislocations propagate parallel to the base plane. The dashed lines represent the different possible shapes of the ELO patterns at the end of the first step;

FIG. 5 shows a set of two images of the surface in cathodoiuminiscence. Each black dot corresponds to emergence of a through dislocation. Part (a) of the image represents a GaN surface produced according to the two-step epitaxy process and part (b) of the image represents a GaN surface produced according to the one-step process. The diameter of the * mark is 20 µm;

FIG. 6 represents 3 example configurations in which the dislocation propagates in an environment that remains symmetric during growth (solid bold lines $t_0$ and dashed lines $t_1$ show two positions at successive times of planes C in (a) and (11-22) in (b) and (b');

FIG. 7 represents the case of symmetrical growth in which the overgrowth of GaN and the opening 5 have a common axis of symmetry;

FIG. 8 represents cases of asymmetrical growth;

FIG. 9(*a*) shows a case of asymmetrical growth obtained when the left facet grows faster that the right facet; 4 and {3 and 5} have discontinuous axes (or planes) of symmetry. All dislocations originating from the opening of the mask are in configuration (c) or (e) at a given moment. Curvature will occur;

FIG. 9(*b*) represents a case of asymmetry obtained by choosing an unequal shape for openings 5*a* and 5*b*; the overgrowths 4*a* and 4*b* coalesce to form a ribbon 4*c* for which the plane of symmetry A4 does not coincide by construction with any of the other planes of symmetry (A1, A2, A3). All dislocations originating from openings in mask 3*a* and 5*b* or that propagate vertically above the mask 3*b*, are in configuration (c) at a given moment. There will be curvature;

FIG. 10, (a) represents a mask with openings along a [1-100] direction with unequal width openings, and (b) and (c) represent a mask with openings along the two type [1-100] directions;

FIG. 11 represents a diagrammatic view of a two-step ELO process starting from openings in the mask with unequal widths. The first step is shown as a thick black line and the second planarization step is shown as a dashed line;

FIG. 12 represents the structure of through dislocations in a GaN layer made by a two-step ELO process, starting from asymmetric openings. The section of two patterns coalesced during the first step is shown as a white line. Dislocations curved at 90° are identified, and no type M dislocation is observed in the smallest pattern. The {11-22} facet that is developed during the second step is shown in dashed grey lines. The type C dislocations that originate from coalescence joint are curved at 90° when they meet this facet (point 2).

FIG. 13 represents the variation of GaN patterns when the process is implemented according to the second embodiment described above;

FIG. 14 represents the variation of GaN patterns when the process is implemented according to the third embodiment described above.

EXAMPLE

The first part of the example has been taken from example 1 in WO 99/20816.

An appropriate vertical reactor is used operating at atmospheric pressure for Organ metallic paralysis in Vapor Phase Epitaxy. A thin layer of gallium nitride (2 µm thick) is deposited on a 200 to 500 µm thick sapphire substrate (0001), by Organ metallic paralysis in Vapor Phase Epitaxy at 1080° C. The gallium source is trimethylgallium (TMGa) and the nitrogen source is ammonia. Many documents describe such a method.

The experimental conditions are as follows:

The gas carrier is a mix of equal quantities of $H_2$ and $N_2$ (4 sl/mn). Ammonia is added through a separate pipe (2 sl/mn).

After growth of the first epitaxial layer of gallium nitride, a thin layer of silicon nitride is deposited in the growth chamber. Asymmetric openings are formed in the dielectric by photolithography, with 1 µm and 2 µm openings (mask in FIG. 10(*a*)). The linear openings are advantageously oriented along a [10-10] direction of GaN although the process described in this example can eventually be carried out for other orientations of openings particularly along the [11-20] direction of GaN.

Epitaxy is resumed on zones exposed using GaN not intentionally doped under operational conditions of the first resumed epitaxy in the two-step process such that the growth rate along the [0001] direction of GaN patterns is sufficiently greater than the growth rate along the direction normal to the inclined sides of the said patterns. Under these conditions, growth anisotropy causes disappearance of the (0001) facet. The first step in use of the process terminates when the (0001) facet of the GaN pattern disappears. At the end of the first step, the patterns are in the shape of strips with a triangular section (with lateral facets with orientation {11-22} or {1-101} depending on whether the initial strips were oriented along [10-10] or [11-20]), with unequal size (FIG. 12).

The second step consists of resuming epitaxy by GaN by modifying the growth anisotropy (by increasing the temperature to 1120° C. or by adding magnesium in the form of a volatile organ metallic form (MeCp2Mg) in the vapor phase). The TMGa flow is 100 µmole/minute. The (0001) facet reappears at the vertex of each GaN pattern obtained in the first phase. These GaN patterns then develop with expansion of the (0001) facets and, on the contrary, a reduction in the flanks. Due to the asymmetry of the triangular patterns, two adjacent flanks (originating from different sized patterns) coalesce before total coalescence of all patterns. In this variant of the ELO, the coalescence zone (or the coalescence joint) of two patterns is no longer a plane parallel to the openings but is a plane inclined at an angle determined by the ratio between the growth rates along the c axis and laterally. The second step terminates when all flanks have completely disappeared, the upper surface of the deposit formed by the coalesced patterns of GaN then being plane.

Use of the process according to the invention as described results firstly in obtaining a plane GaN layer, that can therefore be used as a substrate for the subsequent deposition of the component structure, particularly the laser diode structure, by resumed epitaxy, but also leads to a very advantageous improvement in the crystalline quality of the said substrate. The lines of dislocations originating from the subjacent GaN layer propagate through openings formed in the mask vertically in the patterns created in the first step. But it is found that the dislocation lines are curved at 90° in a second step.

FIG. 12 shows a high resolution electronic microscopy image of the layer thus obtained and the dislocations are curved at 90° above each opening when they meet facets {11-22} during the growth. All that can escape at the beginning of this growth phase are dislocations that originate in the centre of the mask. Defect lines then propagate along directions parallel to the surface of the masked GaN layer.

The invention claimed is:

1. Process for making a film of gallium nitride (GaN) starting from a substrate, by depositing GaN by vapour phase epitaxy, characterised in that the GaN deposit comprises at least one vapour phase epitaxial lateral overgrowth (ELO) step, and in that at least one of these ELO steps is preceded by etching of openings:
    either in a previously deposited dielectric mask,
    or directly in the substrate,
    and in that an asymmetry is introduced into the dislocations environment during one of the ELO steps so as to cause the largest possible number of dislocation curvatures, since curved dislocations do not emerge at the surface of the GaN layer thus obtained wherein the asymmetry in induced:
    (1) by varying growth parameters either by applying an electric field perpendicular to the growth axis, or applying a magnetic field, or by illuminating using a lamp producing UV radiation at about 170 to 400 nm, to cause preferential growth of a single family of facets {11-22}, or
    (2) by making openings with unequal widths or with unequal geometry, either in the dielectric mask or directly in the substrate to apply geometric shapes to the GaN patterns to facilitate the curvature of dislocations.

2. The process according to claim 1, characterized in that asymmetry is introduced by making openings either in the dielectric mask or directly in the substrate, that are adjacent, unequal and asymmetric forming a basic pattern of a periodic network, the basic pattern comprising at least 2 openings.

3. The process according to claim 2, characterized in that the openings are lines, hexagons, triangles or a combination of these openings.

4. The process according to claim 2 or 3, characterized in that the periodic network extends along the [10-10] direction.

5. The process according to claim 1, characterized in that the at least one epitaxial lateral overgrowth (ELO) step is made by vapour phase epitaxy from chlorides and hydrides (HVPE), by OrganoMetallic pyrolysis in Vapour Phase Epitaxy (OMVPE), or by CSVT (Close Space Vapour Transport).

6. The process according to claim 1, characterized in that the at least one epitaxial later overgrowth (ELO) step is done along one of the C(0001), M(1-100), A(11-20), R(1-102), S(10-11) and N(11-23) planes of the substrate.

7. The process according to claim 1, characterized in that the substrate is chosen from among sapphire, ZnO, 6H—SiC, 4H—SiC, 3C—SiC, GaN AIN, LiAiO$_2$, LiGaO$_2$, MgAlO$_4$, Si, HfB$_2$ or GaAs.

8. The process according to claim 7, characterized in that the substrate is a sapphire substrate.

9. The process according to claim 1, characterized in that the gallium nitride is doped during at least one epitaxial lateral growth in vapour phase using a doping substance that can be chosen from among magnesium, zinc, beryllium, calcium, carbon, silicon, oxygen, tin and germanium.

10. The process according to claim 1, characterized in that an isoelectric impurity such as In, Sc, Sb, Bi is introduced in the gallium nitride.

11. The process according to claim 1, characterized in that the openings are etched in a dielectric mask.

12. The process according to claim 11, characterized in that before deposition of the dielectric mask, a GaN base layer is made by vapour phase epitaxy from chlorides and hydrides (HVPE), by OrganoMetallic pyrolysis in Vapour Phase Epitaxy (OMVPE), or by CSVT (Close Space Vapour Transport).

13. The process according to claim 12, characterized in that the formation of the GaN base layer comprises the following steps:
    deposition of silicon nitride with a thickness approximately equal to one atomic plane,
    deposition of a GaN buffer layer,
    high temperature annealing at between 950 and 1120° C, such that the buffer layer changes from a continuous layer to a discontinuous layer formed of GaN patterns in the form of islands, then,
    deposition by epitaxy of GaN.

14. The process for making a film of gallium nitride (GaN) according to claim 11, characterized in that the process comprises two separate vapour phase epitaxial lateral overgrowth (ELO) steps, the GaN deposition during the first step is made in the GaN zones located in the openings, and the GaN deposition during the second step leads to lateral overgrowth until coalescence of the GaN patterns.

15. The process according to claim 14, characterized in that the GaN deposition during the first step is made under growth conditions such that the growth rate along the <1000> direction is greater than the lateral growth rate, and the GaN deposition during the second step is made under modified experimental conditions such that the lateral growth rate is greater than the growth rate along the <1000> direction so as to obtain full coalescence of patterns.

16. The process according to claim 15, characterized in that the modification of the growth conditions to obtain a lateral growth rate higher than the growth rate along the <1000> direction consists of adding magnesium, antimony or bismuth.

17. The process according to claim 1, characterized in that the openings are directly etched in the substrate.

* * * * *

UNITED STATES PATENT AND TRADEMARK OFFICE
CERTIFICATE OF CORRECTION

PATENT NO.       : 7,455,729 B2                                                   Page 1 of 1
APPLICATION NO.  : 10/522397
DATED            : November 25, 2008
INVENTOR(S)      : Beaumont et al.

It is certified that error appears in the above-identified patent and that said Letters Patent is hereby corrected as shown below:

Col. 11, Claim 1, line 13, please delete "asymmetry in" and insert -- asymmetry is --.

Signed and Sealed this

Fifth Day of May, 2009

JOHN DOLL
*Acting Director of the United States Patent and Trademark Office*